(12) United States Patent
Takamiya

(10) Patent No.: US 10,163,971 B2
(45) Date of Patent: Dec. 25, 2018

(54) IMAGE SENSOR, IMAGE CAPTURING APPARATUS, AND FORMING METHOD

(75) Inventor: Makoto Takamiya, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 489 days.

(21) Appl. No.: 14/117,981

(22) PCT Filed: May 31, 2012

(86) PCT No.: PCT/JP2012/064612
§ 371 (c)(1),
(2), (4) Date: Nov. 15, 2013

(87) PCT Pub. No.: WO2012/173029
PCT Pub. Date: Dec. 20, 2012

(65) Prior Publication Data
US 2014/0091205 A1    Apr. 3, 2014

(30) Foreign Application Priority Data

Jun. 14, 2011 (JP) ................................. 2011-132707

(51) Int. Cl.
*H01L 27/146* (2006.01)
*H04N 5/3745* (2011.01)

(52) U.S. Cl.
CPC .... *H01L 27/14683* (2013.01); *H01L 27/1461* (2013.01); *H01L 27/14607* (2013.01); *H01L 27/14627* (2013.01); *H01L 27/14629* (2013.01); *H04N 5/3745* (2013.01); *H04N 5/37457* (2013.01); *Y10T 29/49002* (2015.01)

(58) Field of Classification Search
CPC ............ H01L 27/146; H01L 27/14683; H01L 27/14607; H01L 27/14627; H01L 27/14625; H01L 27/1461; H04N 5/3745; H04N 5/37457
See application file for complete search history.

(56) References Cited

U.S. PATENT DOCUMENTS

| 7,119,319 | B2* | 10/2006 | Noto ................. H01L 27/14621 250/208.1 |
| 7,518,800 | B2 | 4/2009 | Naya ............................ 359/619 |
| 2005/0200734 | A1* | 9/2005 | Ahn .................. H01L 27/14627 348/311 |
| 2006/0033131 | A1* | 2/2006 | Kim .................. H01L 27/14621 257/292 |

(Continued)

FOREIGN PATENT DOCUMENTS

| JP | 6-163866 A | 6/1994 |
| JP | 2000-150845 A | 5/2000 |

(Continued)

*Primary Examiner* — Georgia Y Epps
*Assistant Examiner* — Don Williams
(74) *Attorney, Agent, or Firm* — Venable LLP

(57) ABSTRACT

An image sensor comprising a plurality of pixels, each of at least part of the plurality of pixels comprises: a plurality of photoelectric conversion parts; a microlens; and a plurality of interlayer lenses formed between the plurality of photoelectric conversion parts and the microlens and integrally formed to correspond to the plurality of photoelectric conversion parts. The plurality of interlayer lenses cause light incident on the plurality of interlayer lenses to enter the corresponding plurality of photoelectric conversion parts.

11 Claims, 16 Drawing Sheets

(56) References Cited

U.S. PATENT DOCUMENTS

| | | | |
|---|---|---|---|
| 2009/0207287 A1 | 8/2009 | Miya et al. | 348/273 |
| 2009/0224346 A1* | 9/2009 | Iida | H01L 27/14603 |
| | | | 257/432 |
| 2010/0289929 A1* | 11/2010 | Ohwa | G03B 15/05 |
| | | | 348/241 |
| 2011/0169997 A1 | 7/2011 | Nagano et al. | |
| 2011/0300662 A1* | 12/2011 | Watanabe | 438/70 |
| 2012/0200751 A1* | 8/2012 | Kato et al. | 348/294 |

FOREIGN PATENT DOCUMENTS

| | | |
|---|---|---|
| JP | 2003-244712 A | 8/2003 |
| JP | 2006-49721 A | 2/2006 |
| JP | 2006-303468 A | 11/2006 |
| JP | 2008-042024 A | 2/2008 |
| JP | 2009-158800 A | 7/2009 |
| JP | 2009-175451 A | 8/2009 |

\* cited by examiner

FIG. 2

| (0, 0) a b c d R | (1, 0) a b c d G | (2, 0) a b c d R | (3, 0) a b c d G | (4, 0) a b c d R | (5, 0) a b c d G |
|---|---|---|---|---|---|
| (0, 1) a b c d G | (1, 1) a b c d B | (2, 1) a b c d G | (3, 1) a b c d B | (4, 1) a b c d G | (5, 1) a b c d B |
| (0, 2) a b c d R | (1, 2) a b c d G | (2, 2) a b c d R | (3, 2) a b c d G | (4, 2) a b c d R | (5, 2) a b c d G |
| (0, 3) a b c d G | (1, 3) a b c d B | (2, 3) a b c d G | (3, 3) a b c d B | (4, 3) a b c d G | (5, 3) a b c d B |
| (0, 4) a b c d R | (1, 4) a b c d G | (2, 4) a b c d R | (3, 4) a b c d G | (4, 4) a b c d R | (5, 4) a b c d G |
| (0, 5) a b c d G | (1, 5) a b c d B | (2, 5) a b c d G | (3, 5) a b c d B | (4, 5) a b c d G | (5, 5) a b c d B |

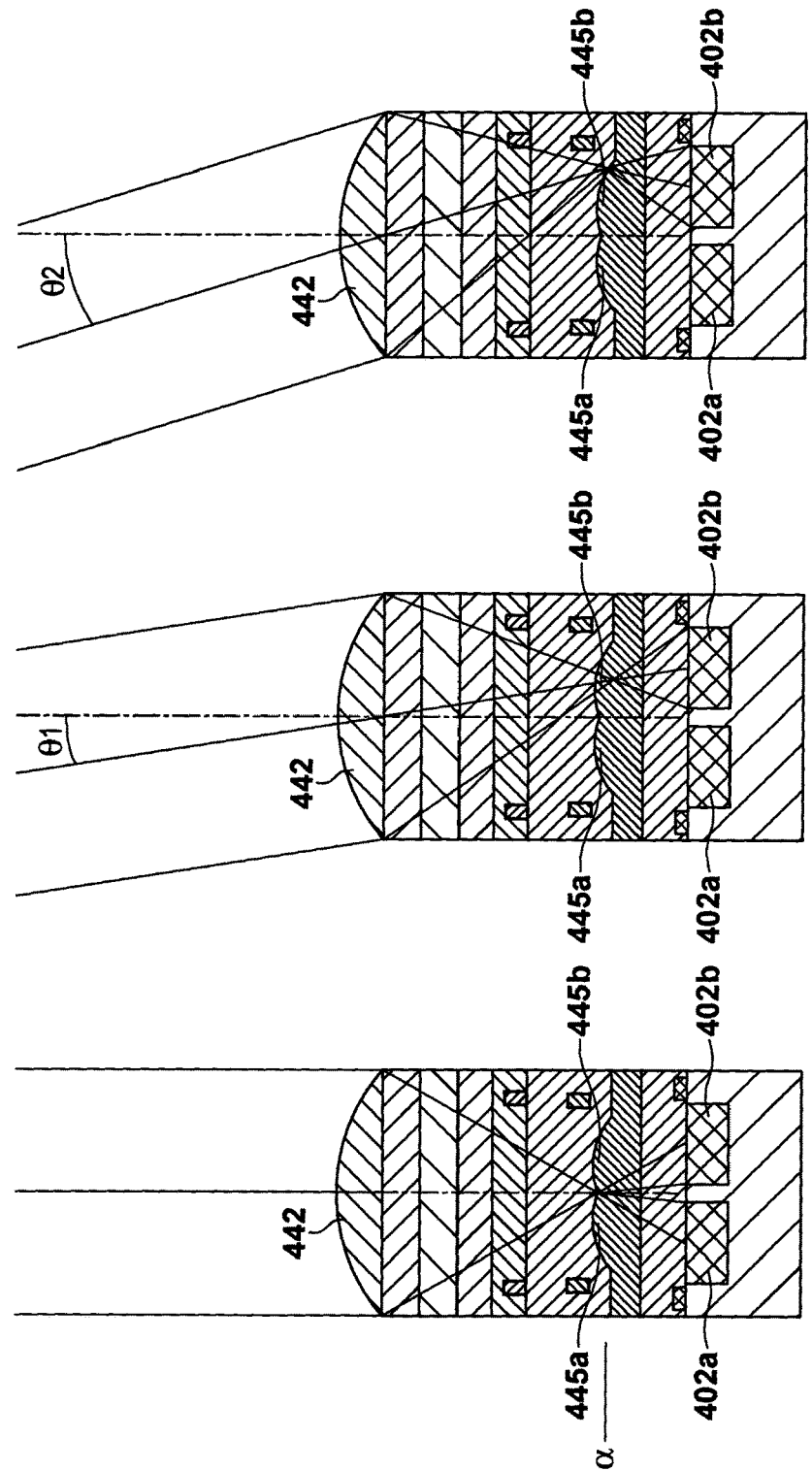

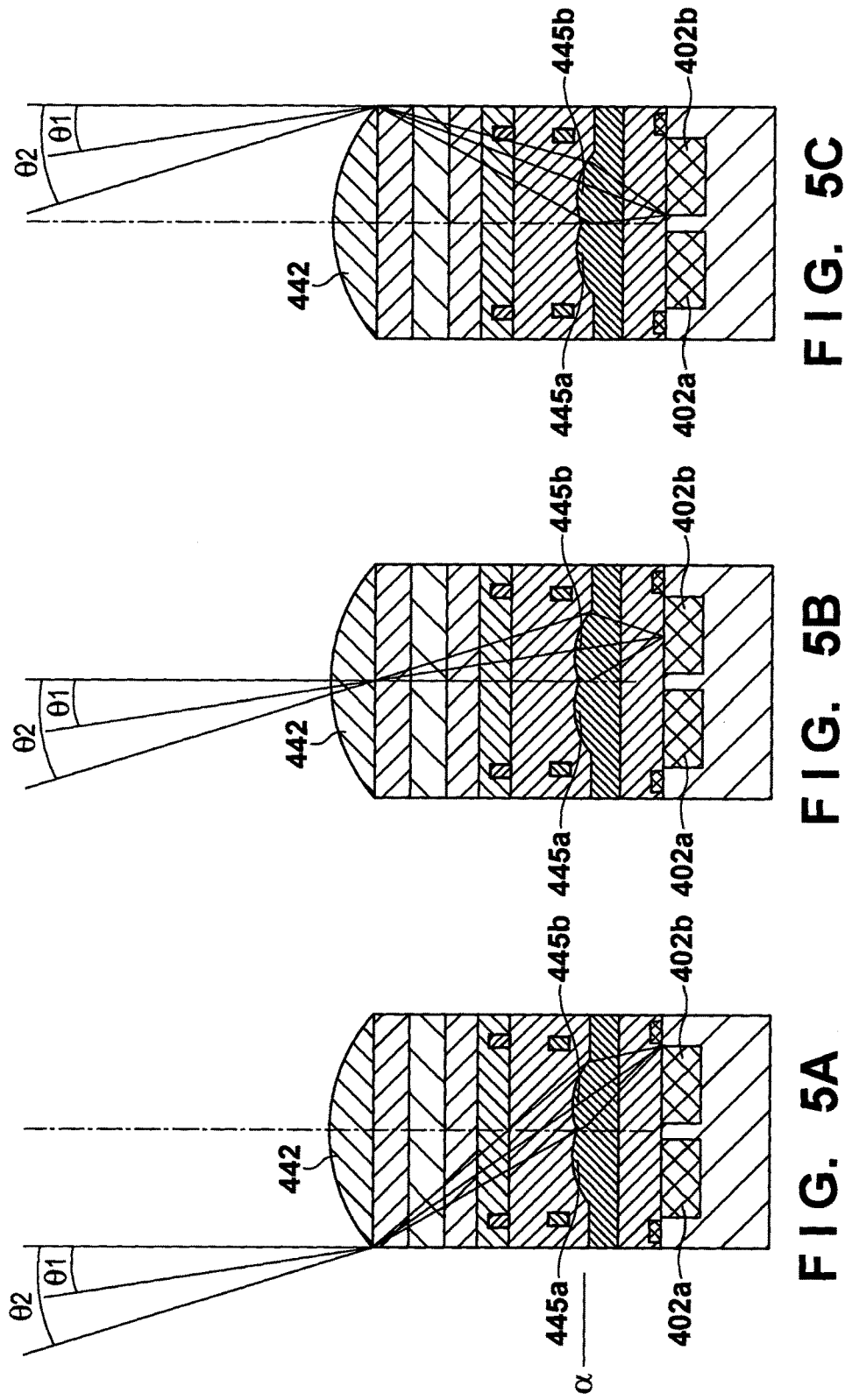

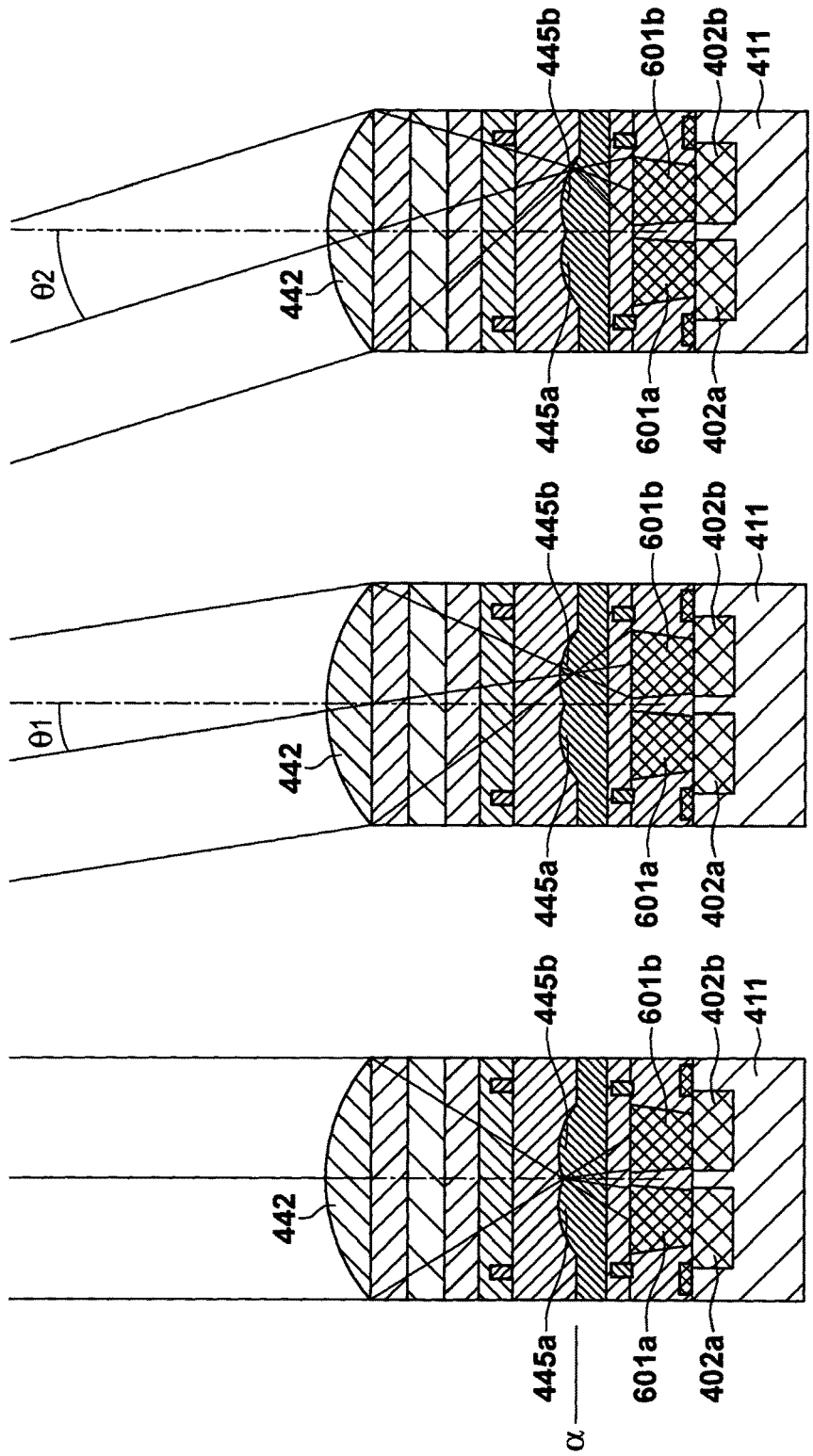

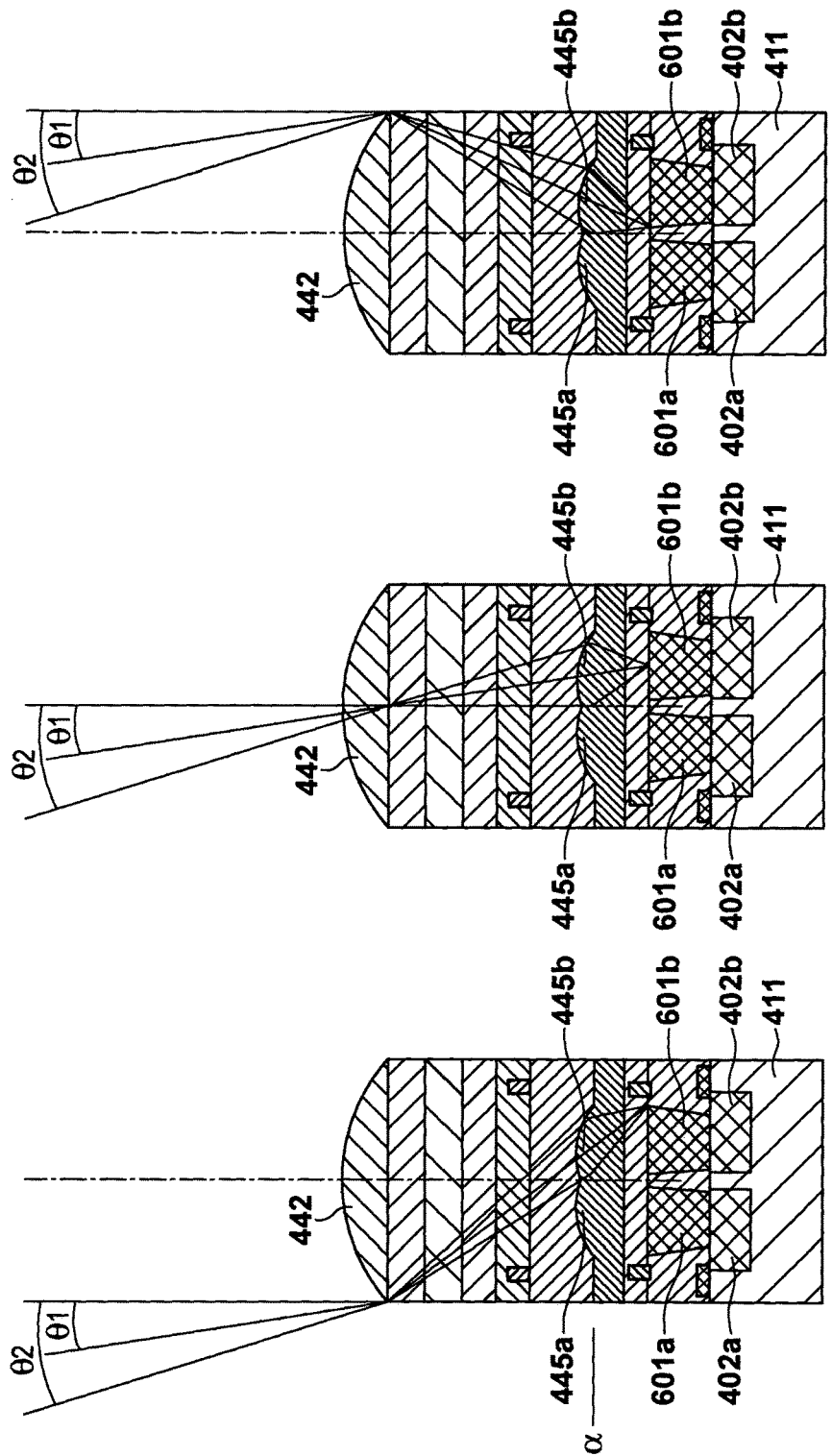

IMAGE SENSOR, IMAGE CAPTURING APPARATUS, AND FORMING METHOD

TECHNICAL FIELD

The present invention relates to an image capturing apparatus used to capture, record, and reproduce still images and moving images, an image sensor used in the image capturing apparatus, and a forming method, and particularly, to a structure of an image sensor when a photoelectric conversion unit of the image sensor has a divided structure.

BACKGROUND ART

Conventionally, there are image capturing apparatus, such as electronic cameras, that include, as a recording medium, a memory card with a solid-state memory element, and records and reproduces still images and moving images captured by a solid-state image sensor, such as CCD and CMOS sensors.

Japanese Patent Laid-Open Nos. 2003-244712 and 2009-158800 propose an example of a technique related to the solid-state image sensor mounted on the image capturing apparatus, in which photoelectric conversion units of part or all of a plurality of pixels forming the solid-state image sensor are divided into a plurality of photoelectric conversion parts. Examples of applications of the image sensor include detecting the focus in a pupil division method and generating a 3D image based on output signals obtained from the divided photoelectric conversion parts. Meanwhile, outputs of the divided photoelectric conversion parts can be added pixel by pixel to use the outputs as a normal imaging signal.

However, there is the following problem when the outputs from the divided photoelectric conversion parts are added and used as a normal imaging signal during normal photographing in the solid-state image capturing apparatus.

When pixels including divided photoelectric conversion parts are formed as in Japanese Patent Laid-Open Nos. 2003-244712 and 2009-158800, various pixel constituent elements may be arranged between the plurality of photoelectric conversion parts of the pixels. For example, to increase the areas of the photoelectric conversion parts to improve the sensitivity, it is preferable that a plurality of photoelectric conversion parts share a floating diffusion unit (FD unit) and the like, instead of arranging the FD unit and an output signal line for each photoelectric conversion part. In this case, it is desirable to arrange the FD unit at the center of the plurality of photoelectric conversion parts that share the FD unit. In this way, if pixel constituent elements, such as the FD unit, are arranged between the photoelectric conversion parts, a non-sensitive area exists between the plurality of photoelectric conversion parts of the divided pixels. Even if the constituent elements arranged between the plurality of photoelectric conversion parts are eliminated, it is difficult to totally eliminate gaps between the plurality of photoelectric conversion parts in the pixels due to manufacturing accuracy, alignment accuracy, and the like of the pixel unit.

For this reason, non-sensitive regions of the pixel constituent elements and separation regions that separate the photoelectric conversion parts (hereinafter, collectively called "separation regions") are necessary between the plurality of photoelectric conversion parts in the pixels. However, when output signals from the plurality of photoelectric conversion parts are added pixel by pixel to use the output signals as one pixel signal, the sensitivity is reduced because of the separation regions, compared to normal pixels in which the photoelectric conversion units are not divided.

Since the separation regions are non-sensitive, the luminous flux that reaches the separation regions is not outputted as the signal. However, the state of the photographing lens, the aperture value, the angle of incident light, and the like change the amount of light reaching the separation regions relative to the amount of light received by the imaging pixels, which causes the output signal to depend on the aperture, the angle of incidence, and the like.

Japanese Patent Laid-Open No. 2009-158800 also proposes a method of forming a space above the photoelectric conversion parts of a pixel to separate the incident light to the divided photoelectric conversion parts. However, the space arranged above the photoelectric conversion parts of a pixel is also a separation region. Therefore, compared to when the pixels are not divided, the sensitivity is reduced, and the characteristics of the angle of incidence are degraded.

SUMMARY OF INVENTION

The present invention has been made in consideration of the above situation, and when a plurality of photoelectric conversion parts formed in one pixel are separated by non-sensitive areas, the decrease in the sensitivity of the pixel and the degradation in the characteristics of the angle of incidence caused by the non-sensitive areas are reduced.

According to the present invention, provided is an image sensor comprising a plurality of pixels, each of at least part of the plurality of pixels comprising: a plurality of photoelectric conversion parts; a microlens; and a plurality of interlayer lenses formed between the plurality of photoelectric conversion parts and the microlens and integrally formed to correspond to the plurality of photoelectric conversion parts, wherein the plurality of interlayer lenses cause light incident on the plurality of interlayer lenses to enter the corresponding plurality of photoelectric conversion parts.

Further, according to the present invention, provided is an image capturing apparatus comprising: a photographing lens; and the image sensor as described above that receives incoming light from the photographing lens.

Furthermore, according to the present invention, provided is a forming method of forming a plurality of interlayer lenses in an image sensor, the image sensor comprising a plurality of pixels, each of at least part of the plurality of pixels comprising: a plurality of photoelectric conversion parts; a microlens; and the plurality of interlayer lenses formed between the plurality of photoelectric conversion parts and the microlens and integrally formed to correspond to the plurality of photoelectric conversion parts, wherein the plurality of interlayer lenses cause light incident on the plurality of interlayer lenses to enter the corresponding plurality of photoelectric conversion parts, the forming method comprising: a first step of forming a layer that serves as a material of the plurality of interlayer lenses; a second step of forming an organic material over the layer formed in the first step; a third process of using a gray-tone mask to form shapes of the plurality of interlayer lenses through photolithography, on the layer formed in the second step; and a fourth process of transferring the shapes formed in the third step to the layer formed in the first process through etchback.

Further features of the present invention will become apparent from the following description of exemplary embodiments (with reference to the attached drawings).

BRIEF DESCRIPTION OF DRAWINGS

The accompanying drawings, which are incorporated in and constitute a part of the specification, illustrate embodiments of the invention, and together with the description, serve to explain the principles of the invention.

FIG. 2 is a layout drawing showing pixel layout of an image sensor according to the first embodiment;

FIGS. 4A to 4C are diagrams showing states of a luminous flux reaching photoelectric conversion parts according to the first embodiment;

FIGS. 5A to 5C are diagrams showing states of the luminous flux reaching the photoelectric conversion parts according to the first embodiment;

FIGS. 15A to 15C are diagrams showing states of a luminous flux reaching the photoelectric conversion parts according to the second embodiment; and FIGS. 16A to 16C are diagrams showing states of the luminous flux reaching the photoelectric conversion parts according to the second embodiment.

DESCRIPTION OF EMBODIMENTS

Exemplary embodiments of the present invention will be described in detail in accordance with the accompanying drawings. The dimensions, materials, shapes and relative positions of the constituent parts shown in the embodiments should be changed as convenient depending on various conditions and on the structure of the apparatus adapted to the invention, and the invention is not limited to the embodiments described herein.

Figure 1:
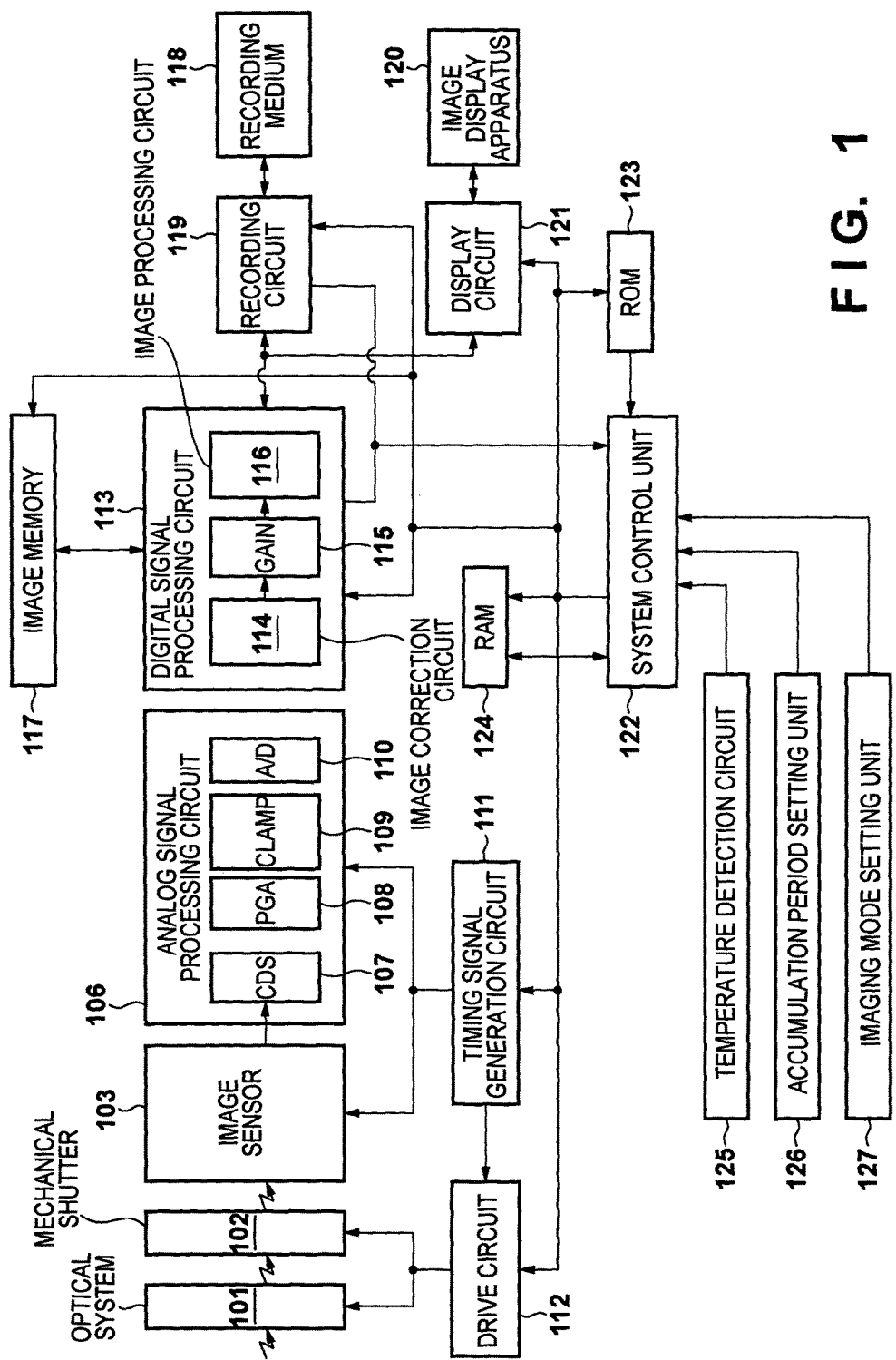
FIG. 1 is a block diagram showing a schematic configuration of an image capturing apparatus according to a first embodiment.

FIG. 1 is a block diagram showing a schematic configuration of an image capturing apparatus according to a first embodiment of the present invention.

In FIG. 1, reference numeral 101 denotes an optical system including a lens and an aperture, and reference numeral 102 denotes a mechanical shutter. Reference numeral 103 denotes an image sensor that converts incident light to an electrical signal and that includes a plurality of pixels. A configuration of the image sensor 103 will be described in detail later.

Reference numeral 106 denotes an analog signal processing circuit that applies analog signal processing to an image signal output from the image sensor 103. The analog signal processing circuit 106 includes: a CDS circuit 107 that performs correlated double sampling; a signal amplifier 108 that amplifies an analog signal; a clamp circuit 109 that performs horizontal OB clamping; and an A/D converter 110 that converts an analog signal to a digital signal.

Reference numeral 111 denotes a timing signal generation circuit that generates signals for operating the image sensor 103 and the analog signal processing circuit 106, and reference numeral 112 denotes a drive circuit of the optical system 101 and the mechanical shutter 102. Reference numeral 113 denotes a digital signal processing circuit that applies necessary digital signal processing to sensed image data. The digital signal processing circuit 113 includes: an image correction circuit 114 that applies a necessary correction process to image data; a signal amplifier circuit 115 that amplifies a digital signal; and an image processing circuit 116 that applies necessary image processing to image data.

Reference numeral 117 denotes an image memory that stores signal-processed image data. Reference numeral 118 denotes a recording medium removable from the image capturing apparatus. Reference numeral 119 denotes a recording circuit that records signal-processed image data in the recording medium 118. Reference numeral 120 denotes an image display apparatus that displays signal-processed image data. Reference numeral 121 denotes a display circuit that displays an image on the image display apparatus 120.

Reference numeral 122 is a system control unit that controls the entire image capturing apparatus. Reference numeral 123 denotes a non-volatile memory (ROM) that stores a program describing a control method executed by the system control unit 122, control data, such as parameters and tables, used in the execution of the program, and correction data of a defective pixel address and the like. Reference numeral 124 denotes a volatile memory (RAM) to which the program, the control data, and the correction data stored in the non-volatile memory 123 are transferred and stored and that is used when the system control unit 122 controls the image capturing apparatus.

Reference numeral 125 denotes a temperature detection circuit that detects the temperature of the image sensor 103 or peripheral circuits of the image sensor 103. Reference numeral 126 denotes an accumulation period setting unit that sets an accumulation period of the image sensor 103. Reference numeral 127 denotes an imaging mode setting unit that sets imaging conditions, such as ISO sensitivity, and that switches still image photographing and moving image photographing.

An imaging operation in the image capturing apparatus with the configuration as described above will be described. Prior to the imaging operation, a necessary program, control data, and correction data are transferred from the non-volatile memory 123 and stored in the volatile memory 124 at the start of the operation of the system control unit 122, such as when the power of the image capturing apparatus is turned on. The system control unit 122 uses the program and the data to control the image capturing apparatus. If necessary, an additional program and data are transferred from the non-volatile memory 123 to the volatile memory 124, or the system control unit 122 directly reads and uses data in the non-volatile memory 123.

The optical system 101 drives the aperture and the lens based on a control signal from the system control unit 122 and forms, on the image sensor 103, a subject image that is set to appropriate brightness. During still image photographing, a control signal from the system control unit 122 drives the mechanical shutter 102 to shield the image sensor 103 in accordance with the operation of the image sensor 103 to set a necessary exposure period. In this case, if the image sensor 103 has an electronic shutter function, the function and the mechanical shutter 102 can be used together to secure a necessary exposure period. During sensing a moving image, a control signal from the system control unit 122 maintains the mechanical shutter 102 in an open state to always expose the image sensor 103.

The image sensor 103 is driven by a drive pulse based on an operation pulse generated by the timing signal generation circuit 111 controlled by the system control unit 122, and the image sensor 103 converts the subject image to an electrical signal through photoelectric conversion. The image sensor 103 applies, to the converted electrical signal, a gain of an amplification factor that is set according to the amount of incident light and outputs an analog image signal.

The analog signal processing circuit 106 processes the analog image signal output from the image sensor 103 based on an operation pulse generated by the timing signal generation circuit 111 controlled by the system control unit 122. Specifically, the CDS circuit 107 removes clock-synchronous noise, and the signal amplifier 108 applies a gain of an amplification factor that is set according to the amount of incident light. The clamp circuit 109 clamps a signal output of a horizontal OB area as a reference voltage, and the A/D converter 110 converts the output to a digital image signal.

The digital signal processing circuit 113 controlled by the system control unit 122 applies image processing, such as color conversion, white balance, and gamma correction, resolution conversion processing, image compression processing, and the like to the digital image signal output from the analog signal processing circuit 106. First the image correction circuit 114 applies various image correction processes, such as defective pixel correction and dark shading correction, and the signal amplifier circuit 115 applies a gain of an amplification factor that is set according to the amount of incident light. The image processing circuit 116 then executes image processing, such as color conversion, white balance, and gamma correction, and various image processes, such as resolution conversion processing and image compression processing.

The image memory 117 is used to temporarily store the digital image signal during the signal processing and to store image data that is a signal-processed digital image signal. The image data signal-processed by the digital signal processing circuit 113 and the image data stored in the image memory 117 are converted by the recording circuit 119 to data suitable for the recording medium 118 (for example, file system data with a hierarchical structure), and the converted data is recorded in the recording medium 118. Alternatively, the image data undergoes a resolution conversion process by the digital signal processing circuit 113, is converted by the display circuit 121 to a signal suitable for the image display apparatus 120 (for example, analog signal of NTSC method), and displayed on the image display apparatus 120.

The digital signal processing circuit 113 may output the digital image signal as image data to the image memory 117 and to the recording circuit 119 without executing signal processing based on the control signal from the system control unit 122. Further, if requested by the system control unit 122, the digital signal processing circuit 113 outputs, to the system control unit 122, information of the digital image signal and the image data generated in the course of the signal processing or information extracted from the digital image signal and the image data. The information of the digital image signal and the image data generated in the course of the signal processing includes information such as a spatial frequency of an image, an average value of image signals/image data within a designated region, and an amount of data of a compressed image. The recording circuit 119 outputs information, such as the type and the free space of the recording medium 118, to the system control unit 122 if requested by the system control unit 122.

Next, a reproduction operation when image data is recorded in the recording medium 118 will be described. The recording circuit 119 reads the image data from the recording medium 118 based on a control signal from the system control unit 122. Also based on the control signal from the system control unit 122, the digital signal processing circuit 113 stores the read image data in the image memory after executing an image expansion process on the image data if the image data is a compressed image or without executing the image expansion process if the image data is not a compressed image. The image data stored in the image memory 117 undergoes a resolution conversion in the digital signal processing circuit 113, is converted by the display circuit 121 to a signal suitable for the image display apparatus 120, and displayed on the image display apparatus 120.

FIG. 2 is a layout drawing for explaining pixel layout of the image sensor 103 according to the first embodiment of the present invention.

In FIG. 2, each area indicated by (0, 0), (1, 0), (0, 1), or the like denotes one pixel in an imaging signal. One microlens is arranged for each pixel in the imaging signal. Although only 6×6 pixels are illustrated in FIG. 2, a multiplicity of pixels are actually provided.

Areas indicated by a, b, c, and d denote a plurality of photoelectric conversion parts formed in each of the plurality of pixels. As shown in FIG. 2, each pixel includes four (2×2) photoelectric conversion parts a, b, c, and d in the present first embodiment. The photoelectric conversion parts indicated by the same symbol are in the same quadrant of the pixels in the positional relationship with the microlens. Letters "R", "G", and "B" described in the pixels indicate hues of color filters formed on the pixels.

When an imaging signal is generated in the image capturing apparatus using the image sensor 103 with the pixel layout shown in FIG. 2, a "sum of output signals from the photoelectric conversion parts a, b, c, and d" of each pixel serves as an output signal of one pixel.

When the output of the image sensor 103 is used as a focus detection signal or a 3D image generation signal, a sum of "output signals of the photoelectric conversion parts a and b" and a sum of "output signals of the photoelectric conversion parts c and d" are generated, or a sum of "output signals of the photoelectric conversion parts a and c" and a sum of "output signals of the photoelectric conversion parts b and d" are generated and used.

Although the photoelectric conversion units of all pixels are divided into four in the example shown in FIG. 2, the present invention is not limited to this as long as the photoelectric conversion units of at least part of the pixels of the image sensor 103 are divided into two or more photoelectric conversion parts.

Figure 3:
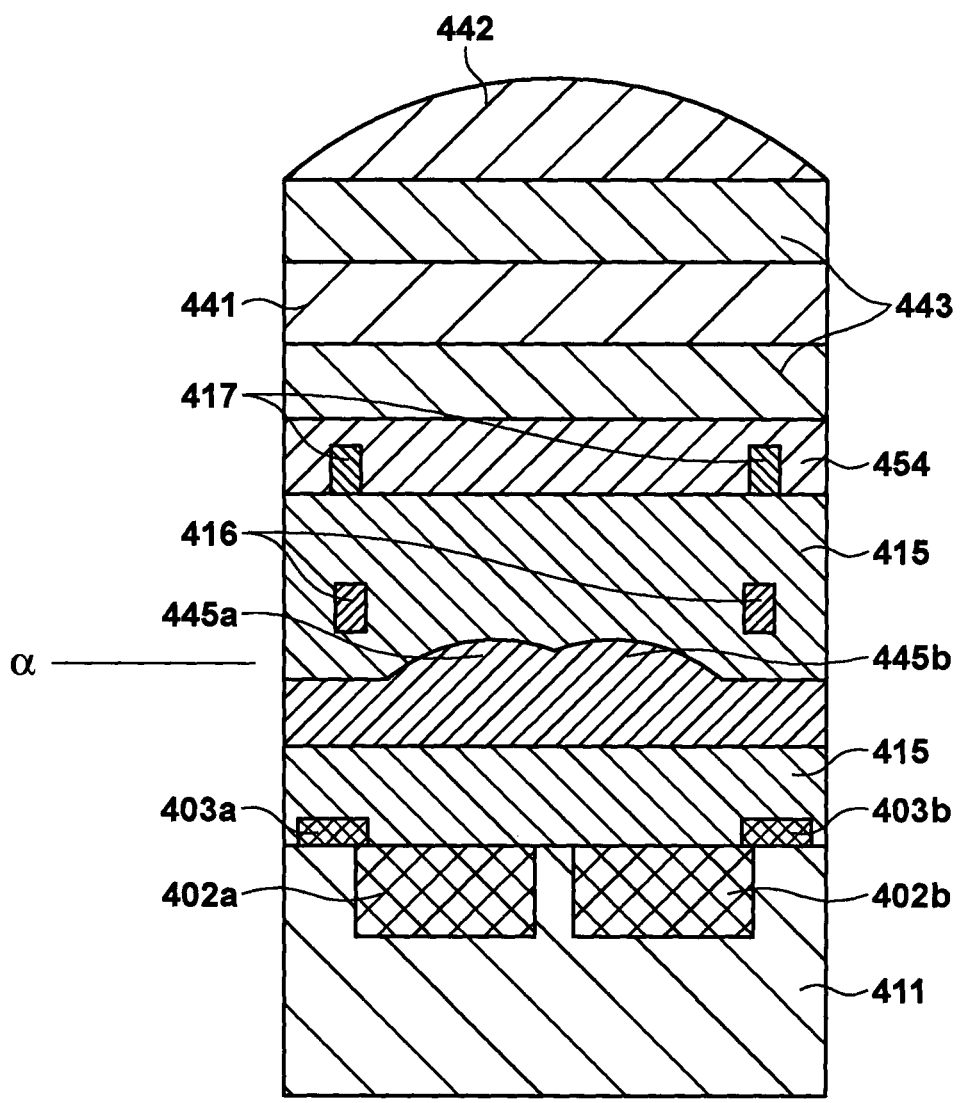
FIG. 3 is a cross-sectional view of one imaging pixel of the image sensor according to the first embodiment.

A structure of the pixels forming the image sensor 103 according to the first embodiment will be described. FIG. 3 is a cross-sectional view in a horizontal direction of one pixel of the image sensor 103 according to the first embodiment. The pixel shown in FIG. 3 illustrates two photoelectric conversion parts a and b (402a and 402b in FIG. 3) in the horizontal direction of the image sensor 103, of the four divided photoelectric conversion parts described with reference to FIG. 2. Although the other two photoelectric conversion parts c and d are not shown, the parts with the same configuration as the photoelectric conversion parts 402a and 402b are arranged in a depth direction of FIG. 3.

First electrodes 403a and 403b made of polysilicon for transferring the charge generated by the photoelectric conversion parts 402a and 402b are arranged around the photoelectric conversion parts 402a and 402b.

Interlayer lenses 445a and 445b respectively corresponding to the photoelectric conversion parts 402a and 402b are integrally formed on the light incident side of the photoelectric conversion parts 402a and 402b. Actually, interlayer lenses 445c and 445d (not shown) respectively corresponding to the photoelectric conversion parts 402c and 402d (not shown) also exist in the depth direction of FIG. 3, and the shapes of the interlayer lenses 445a to 445d will be described later in detail with reference to FIG. 7.

Second electrodes 416 and third electrodes 417 made of aluminum are arranged to selectively output the transferred charge to the outside. Interlayer insulation films 415 are arranged between the first electrodes 403a and 403b and the second electrodes 416 and between the second electrodes 416 and the third electrodes 417. A first plug and a second plug (not shown) made of tungsten connect the first electrodes 403a and 403b and the second electrodes 416 as well as the second electrodes 416 and the third electrodes 417.

A silicon nitride (SiN) film 454 as a protection layer is formed over the third electrodes 417. A color filter 441 is formed on the light incident side of the SiN film 454 through a planarization layer 443. A microlens 442 is formed over the color filter 441 through a planarization layer 443. The thickness of the microlens 442 is set to have lens power that brings a pupil of a photographing lens (not shown) and an upper surface of the interlayer lenses 445a and 445b (image forming surface α of FIG. 3) into a substantial image formation relationship.

Light that enters the image sensor 103 according to the first embodiment will be described. The color filter 441 partially absorbs the luminous flux incident on the microlens 442 in the pixel shown in FIG. 3, and the luminous flux is converged near the surface (image forming surface α) of the interlayer lenses 445a and 445b. As the microlens 442 forms the substantial image formation relationship between the pupil of the photographing lens (not shown) and the surface of the interlayer lenses 445a and 445b (image forming surface α), the luminous flux incident on the interlayer lenses 445a and 445b reaches the photoelectric conversion parts 402a and 402b. Therefore, the photoelectric conversion parts 402a and 402b can receive the luminous flux of the pupil region where the apertures of the interlayer lenses 445a and 445b are projected on the pupil of the photographing lens.

According to the structure of the image sensor 103 of the first embodiment as described above, the luminous flux that would enter the separation region between the photoelectric conversion parts 402a and 402b conventionally can be converged on the photoelectric conversion parts 402a and 402b through the interlayer lenses 445a and 445b.

FIGS. 4A to 4C show states in which a luminous flux is converged on the apertures of the interlayer lenses 445a and 445b near the image forming surface of the microlens 442, and the luminous flux reaches the photoelectric conversion parts according to the first embodiment.

FIG. 4A shows a state of a luminous flux at an angle of incidence 0, and the luminous flux is converged right at the center of the apertures of the interlayer lenses 445a and 445b. The interlayer lenses 445a and 445b then refract the luminous flux, and the luminous flux spreads and reaches the photoelectric conversion parts 402a and 402b, respectively.

FIG. 4B shows a state of a luminous flux at an angle of incidence θ1, and the luminous flux is converged at the optical center (apex of curvature) of the interlayer lens 445b. The interlayer lens 445b then refracts the luminous flux, and the luminous flux spreads and reaches the photoelectric conversion part 402b.

FIG. 4C shows a state of the luminous flux at an angle of incidence θ2, and the luminous flux is converged at the edge of the interlayer lens 445b. The interlayer lens 445b then refracts the luminous flux, and the luminous flux spreads and reaches the photoelectric conversion part 402b.

FIGS. 5A to 5C are diagrams showing that the aperture position of the microlens 442 and the photoelectric conversion part 402b are conjugate due to the interlayer lens 445 according to the first embodiment.

FIG. 5A shows a state in which a luminous flux that has reached the left edge of the microlens 442 at the angles of incidence 0 to θ2 reaches the photoelectric conversion part 402b. As can be understood from FIG. 5A, the luminous flux is refracted by the microlens 442 and transmits through the entire aperture of the interlayer lens 445b, and is converged at the right edge of the photoelectric conversion part 402b.

FIG. 5B shows a state in which a luminous flux that has reached the center of the microlens 442 at the angles of incidence 0 to θ2 reaches the photoelectric conversion part 402b. As can be understood from FIG. 5B, the luminous flux is refracted by the microlens 442 and transmits through the entire aperture of the interlayer lens 445b, and is converged at the center portion of the photoelectric conversion part 402b.

FIG. 5C shows a state in which a luminous flux that has reached the right edge of the microlens 442 at the angles of incidence 0 to θ2 reaches the photoelectric conversion part 402b. As can be understood from FIG. 5C, the luminous flux is refracted by the microlens 442 and transmits through the entire aperture of the interlayer lens 445b, and is converted at the left edge of the photoelectric conversion part 402b.

Although the luminous flux with angles of incidence in the left direction in the drawings has been described in FIGS. 4A to 4C and 5A to 5C, a luminous flux with angles of incidence in the right direction in the drawings enters photoelectric conversion part 402a.

A manufacturing method of the image sensor 103 according to the first embodiment of the present invention will be described with reference to FIGS. 6A to 6I. FIGS. 6A to 6I are cross-sectional views of manufacturing processes of one pixel in a manufacturing method of the image sensor 103 according to the first embodiment of the present invention.

Figure 6A:
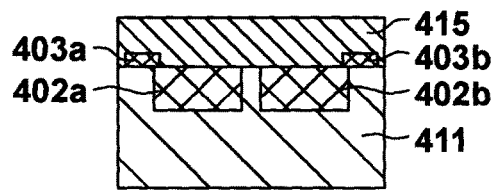
FIGS. 6A to 6I are cross-sectional views of manufacturing processes of one pixel in a manufacturing method of the image sensor according to the first embodiment.

In the process shown in FIG. 6A, the first electrodes 403a and 403b are formed on a semiconductor substrate 411 in which the photoelectric conversion parts 402 are formed. The first electrodes 403a and 403b are formed by, for example, polysilicon (p-Si). The interlayer insulation film 415 is formed to cover the photoelectric conversion parts 402a and 402b as well as the first electrodes 403a and 403b. The interlayer insulation film 415 is formed by, for example, silicon dioxide ($SiO_2$).

Figure 6B:
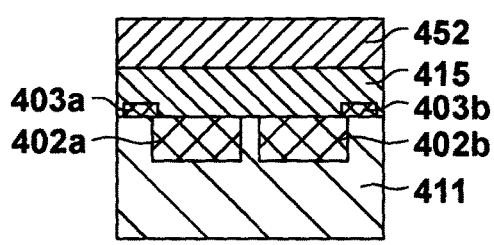

In the process shown in FIG. 6B, a layer 452 as a material of the interlayer lenses 445a and 445b is formed by a highly refractive material, such as silicon nitride (SiN).

Figure 6C:
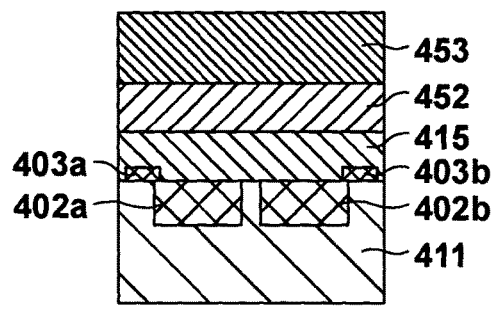

In the process shown in FIG. 6C, spin coating is applied to an organic material to form a planarization layer 453.

In the process shown in FIG. 6D, gapless microlenses 453a and 453b based on photolithography using a gray-tone mask described later is formed on the planarization layer 453.

Figure 6D:
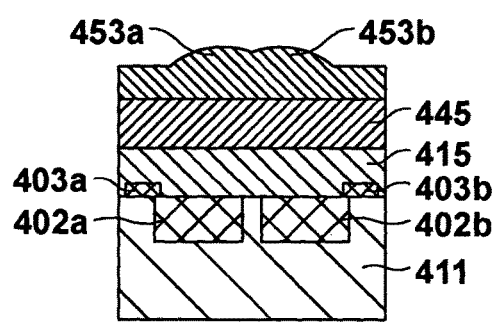
Figure 6E:
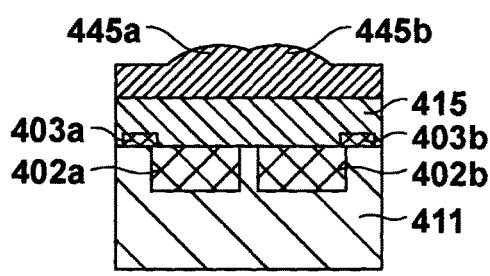

In the process shown in FIG. 6E, etchback is performed to transfer shapes of the microlenses formed in FIG. 6D to the layer 452 formed by a highly refractive material (for example, SiN) to form the interlayer lenses 445a and 445b.

Figure 6F:
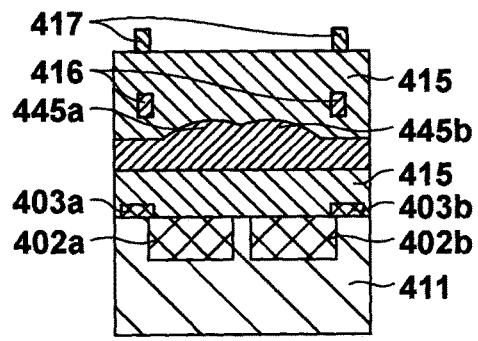

In the process shown in FIG. 6F, the second electrodes 416, the third electrodes 417, the interlayer insulation films 415, and through-hole wiring not shown are formed.

Figure 6G:
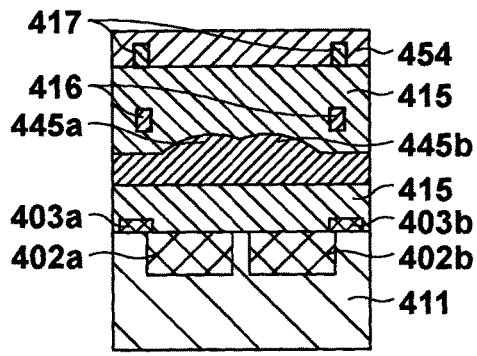

In the process shown in FIG. 6G, the SiN film 454 as a protection layer for protecting the electrodes is formed. The SiN film 454 is formed with a thickness of, for example, 10 nm.

Figure 6H:
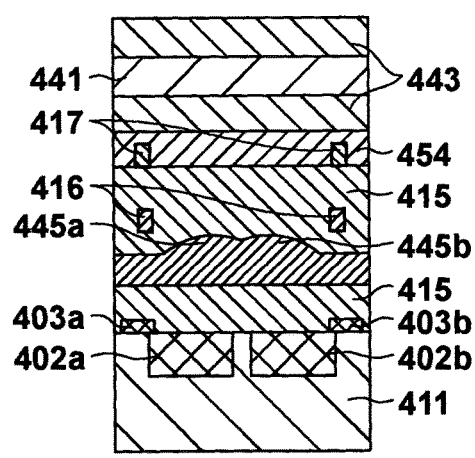

In the process shown in FIG. 6H, spin coating of an organic material is applied over the SiN film 454 to form the planarization layer 443. The color filter 441 is formed over the planarization layer 443 by photolithography. Spin coating of the organic material is applied over the color filter 441 to form another planarization layer 443.

Figure 6I:
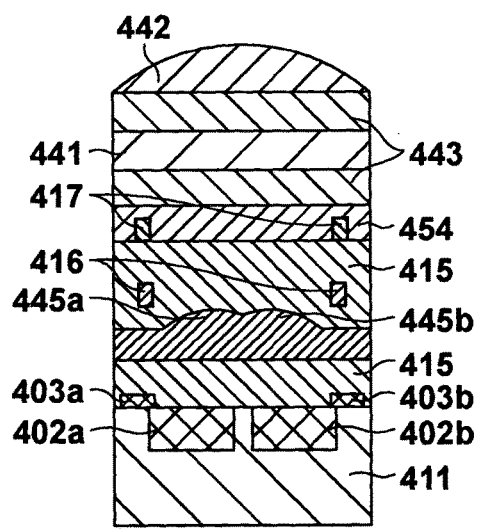

In the process shown in FIG. 6I, the microlens 442 is formed over the planarization layer 443. For example, a film formed with an organic material or the like is patterned over the planarization layer 443, and the pattern is thermally fused to form the spherical microlens 442.

A forming method of the microlenses 453a and 453b in the process of FIG. 6D before the shape transfer to form the interlayer lenses 445a and 445b will be described.

In a conventional microlens, a resist pattern similar to the aperture shape of the microlens is formed in the photolithography process, and then the pattern is thermally fused to form a spherical microlens. The conventional manufacturing method cannot be applied to form gapless-shaped interlayer lenses of the present invention. Therefore, a process of changing a resist removal depth at different exposed sections is applied based on photolithography using a gray-tone mask.

Figure 7:
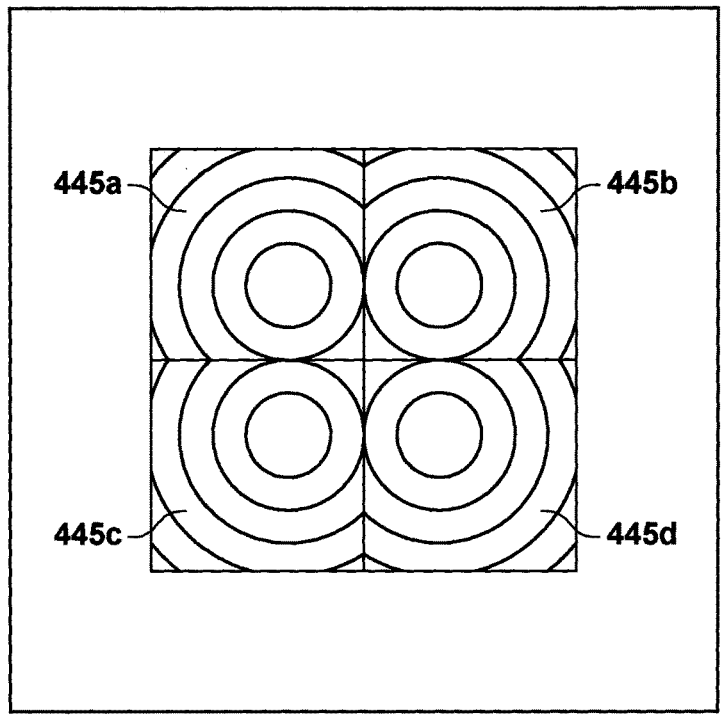
FIG. 7 is a plan view showing contour lines of interlayer lenses according to the first embodiment.
Figure 8:
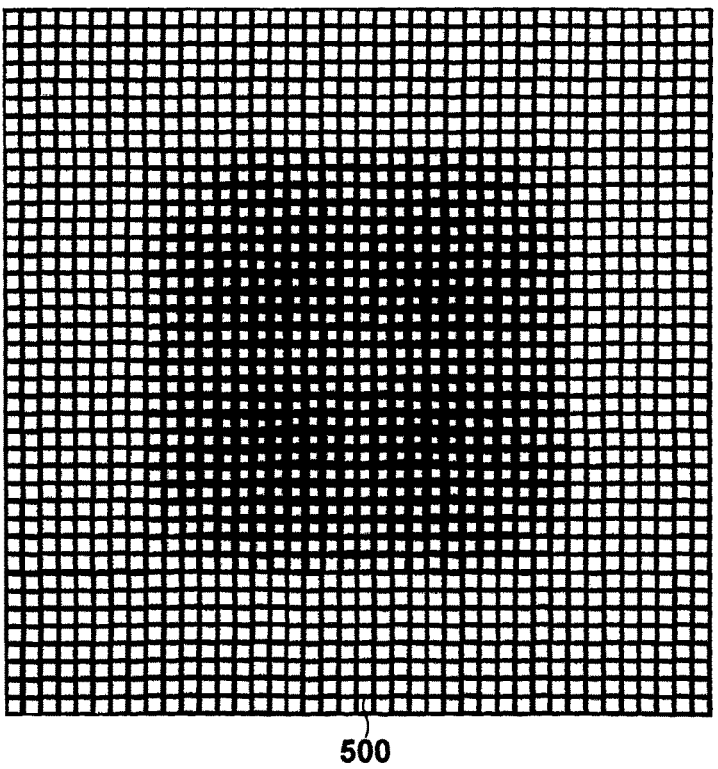
FIG. 8 is a plan view showing an example of a gray-tone mask used to manufacture the interlayer lenses according to the first embodiment.

FIG. 7 shows contour lines of the interlayer lenses 445a to 445d, and FIG. 8 shows an example of a gray-tone mask 500.

As can be recognized from FIG. 7, the regions of four interlayer lenses 445a to 445d are divided at sections with optical power, and the lenses are integrally formed. Such a state is called a gapless lens structure. In the gapless lens structure, there is no optically blind zone in the boundary regions between the interlayer lenses 445a to 445d, and all luminous flux entered from the microlens 442 to the apertures of the interlayer lenses 445a to 445d reaches the photoelectric conversion parts 402. Therefore, all the luminous flux reach the photoelectric conversion parts 402a to 402d without reaching the blind zone, and can be photoelectrically converted.

As shown in FIGS. 5A to 5C, the aperture position of the microlens 442 and the photoelectric conversion parts 402a to 402d are conjugate due to the interlayer lenses 445a to 445d. Therefore, the optical axes of the interlayer lenses 445a to 445d are shifted toward the center of the image sensor 103 from the centers of the photoelectric conversion parts 402a to 402d. Therefore, it is desirable that the optical axes of the interlayer lenses 445a to 445d are asymmetrical inward relative to the apertures of the interlayer lenses 445a to 445d. However, the arrangement of the photoelectric conversion parts 402a to 402d can be devised to make the optical axes symmetrical by square-shaped apertures.

Figure 9:
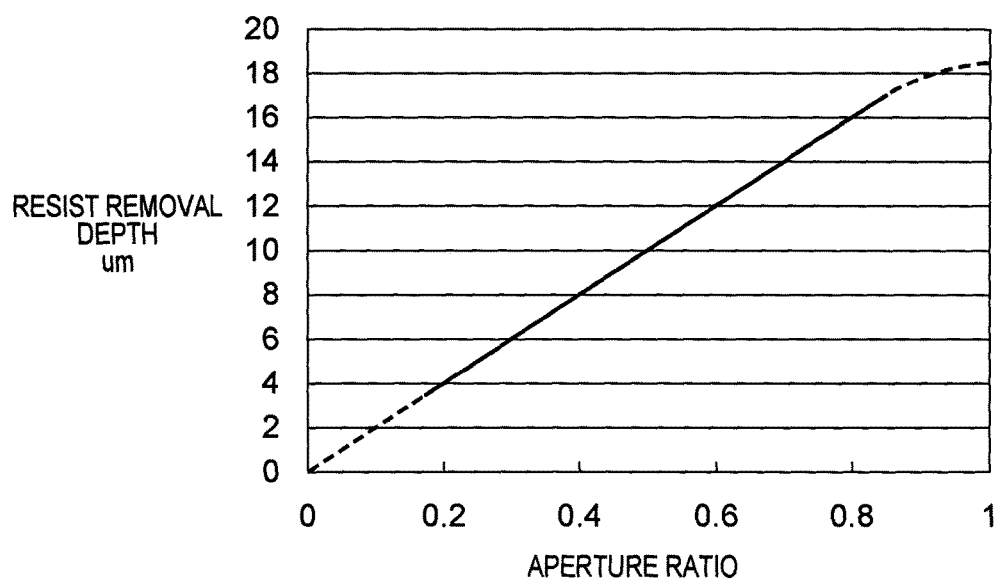
FIG. 9 is a graph showing a relationship between an aperture ratio and a resist removal depth in the gray-tone mask.

Although a terraced shape is formed relative to the original design shape in FIG. 8, the error from the design shape can be reduced by reducing the single pattern pitch of the gray-tone mask 500, and the substantial difference can be eliminated. FIG. 9 is a graph showing a relationship between an aperture ratio and a resist removal depth within the single pattern of the gray-tone mask 500. By obtaining such relationship data in advance for the exposure apparatus and the resist material, it is possible to convert the data of the microlens design shape to the pattern of the gray-tone mask 500.

According to the method, an arbitrary aperture shape and surface curvature can be formed for the microlens. In this way, the microlenses 453a to 453d can be manufactured by changing the mask pattern used in the conventional manufacturing method, and the gapless interlayer lenses 445a to 445d as shown in FIG. 7 can be formed at about the same cost as in the conventional technique.

Figure 10:
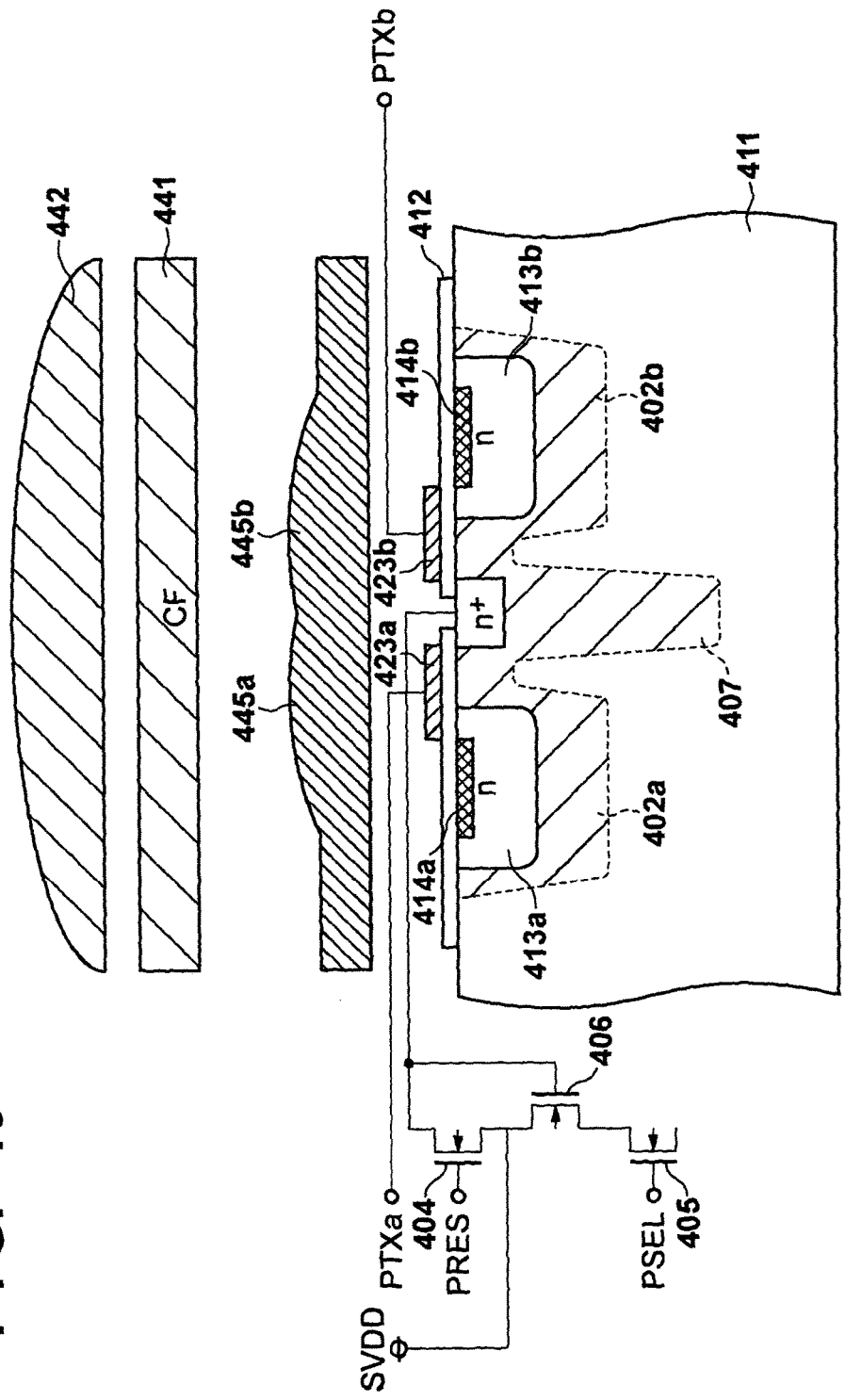
FIG. 10 is a schematic cross-sectional view of one pixel of the image sensor according to the first embodiment.

FIG. 10 is a schematic cross-sectional view of one pixel of the image sensor 103 according to the first embodiment. In FIG. 10, reference numeral 411 denotes a p-type well that is a semiconductor substrate, and reference numeral 412 denotes a gate insulation film formed by a silicon dioxide (SiO$_2$) film. Reference numerals 414a and 414b denote p+ layers formed on the surface of the p-type well 411, and the p+ layers form the photoelectric conversion parts 402a and 402b along with n layers 413a and 413b. Reference numerals 423a and 423b denote transfer gates for transferring signal charge generated by the photoelectric conversion parts 402a and 402b to a floating diffusion (FD) unit 407. Reference numeral 441 denotes a color filter, and reference numeral 442 denotes a microlens (on-chip lens). The microlens 442 is formed in a shape and at a position so as to make the pupil of the not-shown photographing lens (optical system 101) and the photoelectric conversion parts 402a and 402b of the image sensor 103 substantially conjugate.

The interlayer lenses 445a and 445b are arranged between the photoelectric conversion parts 402a and 402b and the color filter 441, respectively.

In the pixel, four photoelectric conversion parts 402a to 402d that share the FD unit 407 are formed around the FD unit 407. Further, the transfer gates 423a and 423b that transfer the signal charge generated by the photoelectric conversion parts 402a and 402b to the FD unit 407 are formed. Although not shown, transfer gates 423c and 423d are also similarly formed for the photoelectric conversion parts 402c and 402d.

Figure 11:
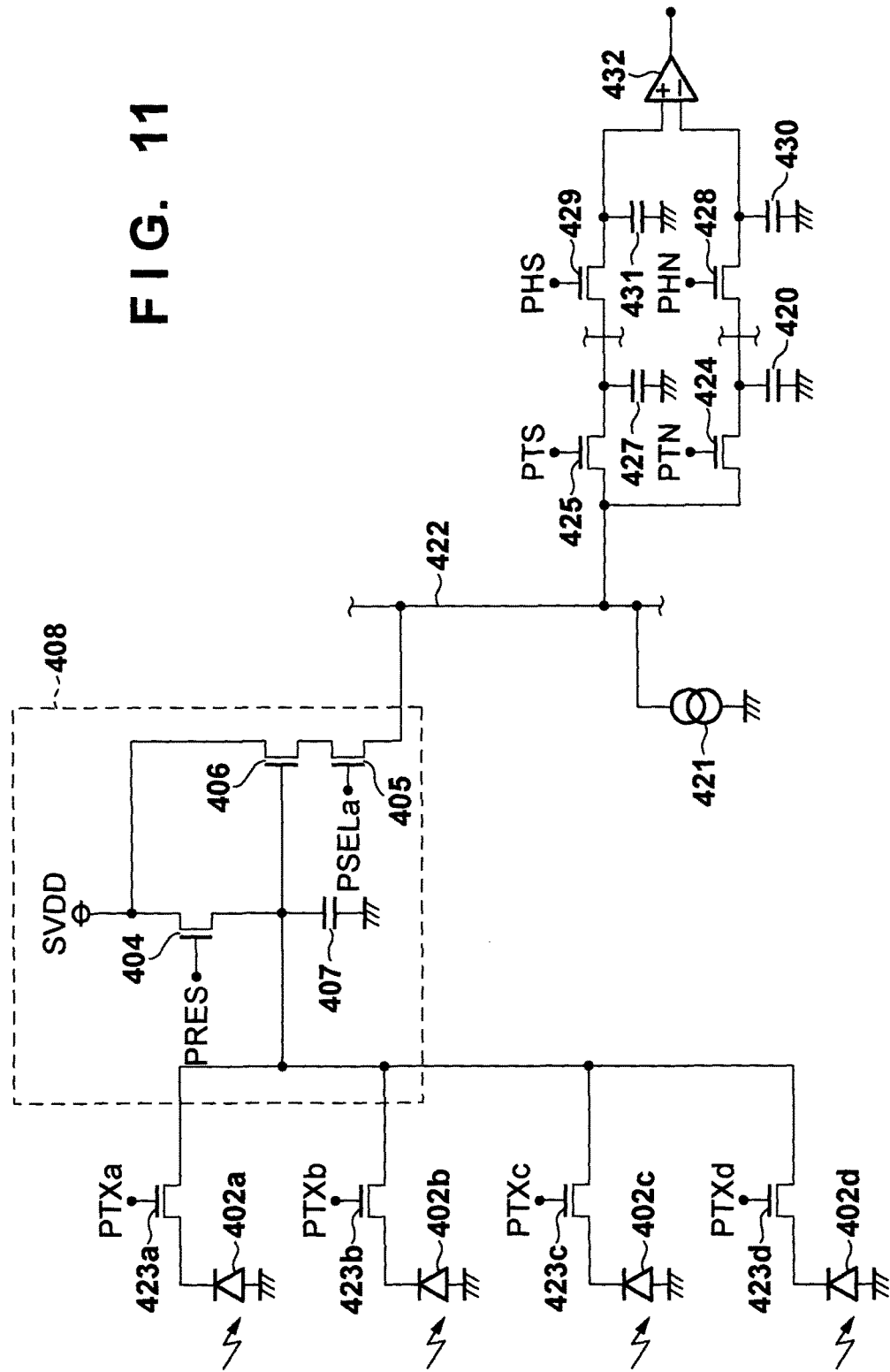
FIG. 11 is a circuit diagram showing a configuration of one pixel of the image sensor and a configuration of the reading circuit according to the first embodiment.

FIG. 11 is a circuit diagram showing a configuration of one pixel of the image sensor 103 and a configuration of a reading circuit according to the first embodiment. In FIG. 11, reference numeral 408 denotes a pixel common unit arranged for each pixel, i.e. for four photoelectric conversion parts 402a to 402d. The transfer gates 423a to 423d transfer the charge generated by photoelectric conversion of the photoelectric conversion parts 402a to 402d to the FD unit 407 based on control of pulses PTXa to PTXd.

The pixel common unit 408 includes: the FD unit 407 that accumulates the charge transferred by the transfer gates 423a to 423d; and a reset switch 404 that resets the FD unit 407 connected to the gate of a pixel amplifier 406 to a level of a potential SVDD based on a reset pulse PRES. The pixel common unit 408 further includes: the pixel amplifier 406 that amplifies the charge accumulated in the FD unit 407 as a source follower; and a line selection switch 405 that selects a pixel in a line selected by a vertical scanning circuit not shown based on a selection pulse PSEL.

The charge of the pixel in the line selected by the line selection switch 405 is amplified by the source follower with a load current source 421, and the charge is output to a vertical output line 422. At this timing, a signal output pulse PTS turns on a transfer gate 425, and the charge on the vertical output line 422 is accumulated in a transfer capacitor 427. Meanwhile, the charge of noise components of the line selected by the line selection switch 405 is also amplified by the source follower with the load current source 421, and the charge is output to the vertical output line 422. At this timing, a noise output pulse PTN turns on a transfer gate 424, and the charge on the vertical output line 422 is accumulated in a transfer capacitor 426. Then, the noise components are accumulated in a capacitor 430, and the signal components are accumulated in a capacitor 431 through transfer switches 428 and 429, respectively, based on control signals PHN and PHS from a horizontal scanning circuit (not shown). Lastly, a differential amplifier 432 outputs the difference between the noise components and the signal components as a pixel signal.

Figure 12:
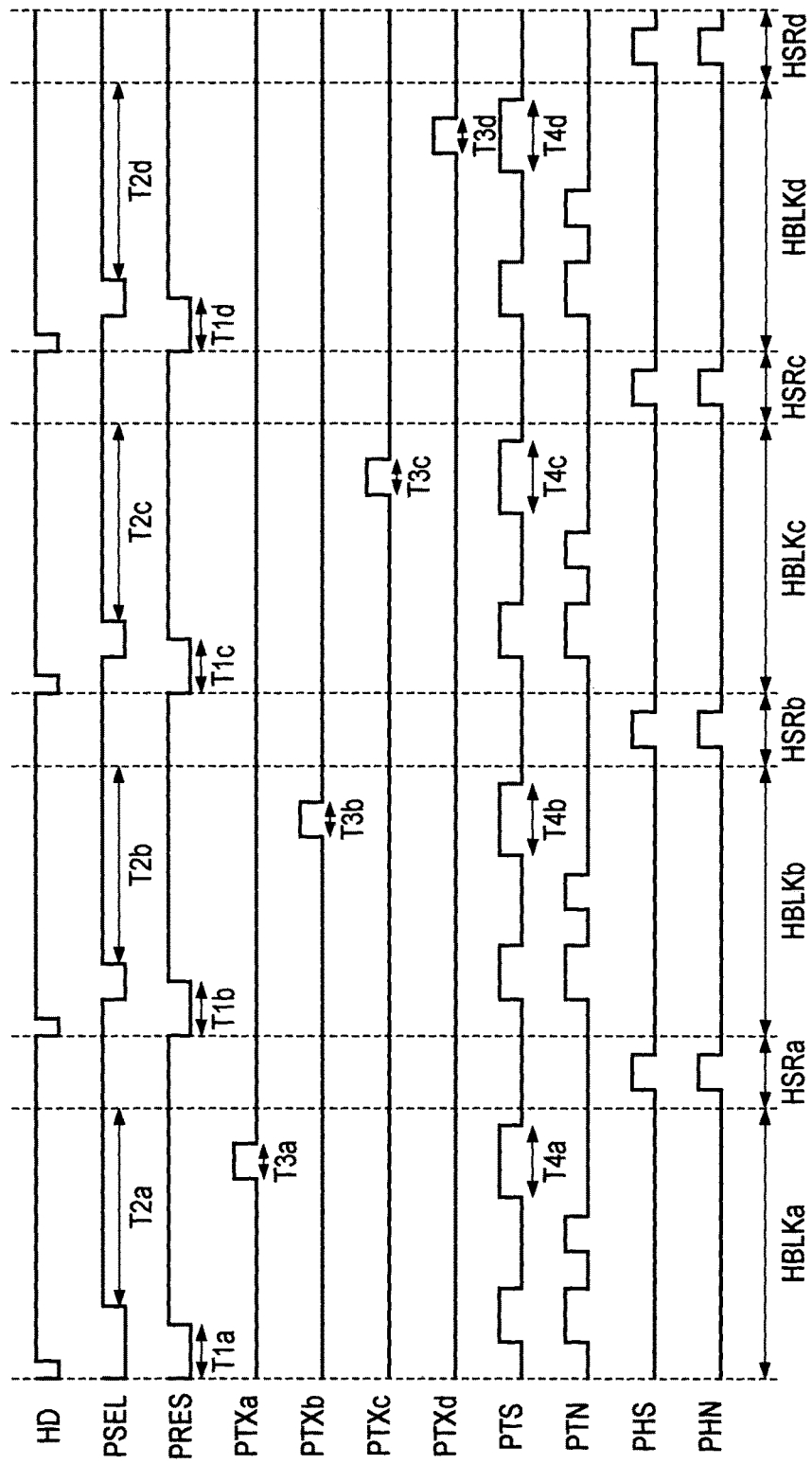
FIG. 12 is a timing chart showing a first drive timing according to the first embodiment.

FIG. 12 is a timing chart showing a first drive timing according to the first embodiment. The first drive timing described in FIG. 12 is a drive timing for independently reading the output signals of the photoelectric conversion parts 402a to 402d shown in FIG. 11. When the signals are read based on the first drive timing, the digital signal processing circuit 113 can process the output signals into focus detection signals or 3D image generation signals.

In the drive described in the timing chart of FIG. 12, the signals are read in the order of the photoelectric conversion parts 402a, 402b, 402c, and 402d.

The signal of the photoelectric conversion part 402a is read in a period of HBLKa+HSRa. First a not-shown circuit resets the vertical output line 422 to a constant potential at the trailing edge of a signal HD indicating the start of one horizontal scanning period. The PRES signal then turns on the reset switch 404, and the charge accumulated in the FD unit 407 formed at the gate of the pixel amplifier 406 is reset to the constant potential SVDD at a period of T1a.

The PRES signal is set to a high level to turn off the reset switch 404, and the PSEL signal is set to a high level. As a result, a MOS transistor as the line selection switch 405 and a source follower circuit formed with the load current source 421 are activated, and noise according to the floating gate reset potential of the pixel amplifier 406 is output to the vertical output line 422. The PTN signal is set to a high level in the period in which PSEL is at a high level, and the transfer capacitor 426 that accumulates the noise components is connected to the vertical output line 422, and the transfer capacitor 426 holds a signal of the noise components.

Then, a mixed signal of the optical charge and the noise components generated by the photoelectric conversion part 402a is accumulated. A not-shown circuit resets the vertical output line 422 to a constant potential. Thereafter, the PTXa signal is set to a high level, the transfer gate 423a is turned on in a period of T3a, and the optical charge accumulated in the photoelectric conversion part 402a is transferred to the floating gate of the pixel amplifier 406. At this time, the PSEL signal remains at a high level. Therefore, the source follower circuit is activated, and "optical signal+noise signal" according to the potential of the floating gate of the pixel amplifier 406 is output to the vertical output line 422. The PTS signal is set to a high level during a period T4a including the period of T3a. As a result, the transfer capacitor 427 is connected to the vertical output line 422, and the transfer capacitor 427 holds a signal of optical charge components+noise components.

In this way, the transfer capacitors 426 and 427 hold the noise components of one line and the optical signal+noise components of one line generated by the photoelectric conversion part 402a, respectively.

In a period of HSRa, the signals accumulated in the transfer capacitors 426 and 427 are transferred to the capacitors 430 and 431, respectively, based on the control pulses PHN and PHS controlled by a horizontal shift register (not shown). For the noise components and the optical signal+noise components accumulated in the capacitors 430 and 431, the differential amplifier 432 calculates a difference of (optical signal+noise components)−noise components and outputs the optical signal.

In a period of HBLKb+HSRb, the control signals PTXb, PRES, and PSEL are controlled to read the signal from the photoelectric conversion part 402b. The timing of reading the signal from the photoelectric conversion part 402b is the same as the timing of reading the signal from the photoelectric conversion part 402a, and the description will not be repeated. The signals from the photoelectric conversion parts 402c and 402d are also read in the same way.

As a result of the reading, the reading of the signals of four photoelectric conversion parts 402a to 402d of one line is finished.

Figure 13:
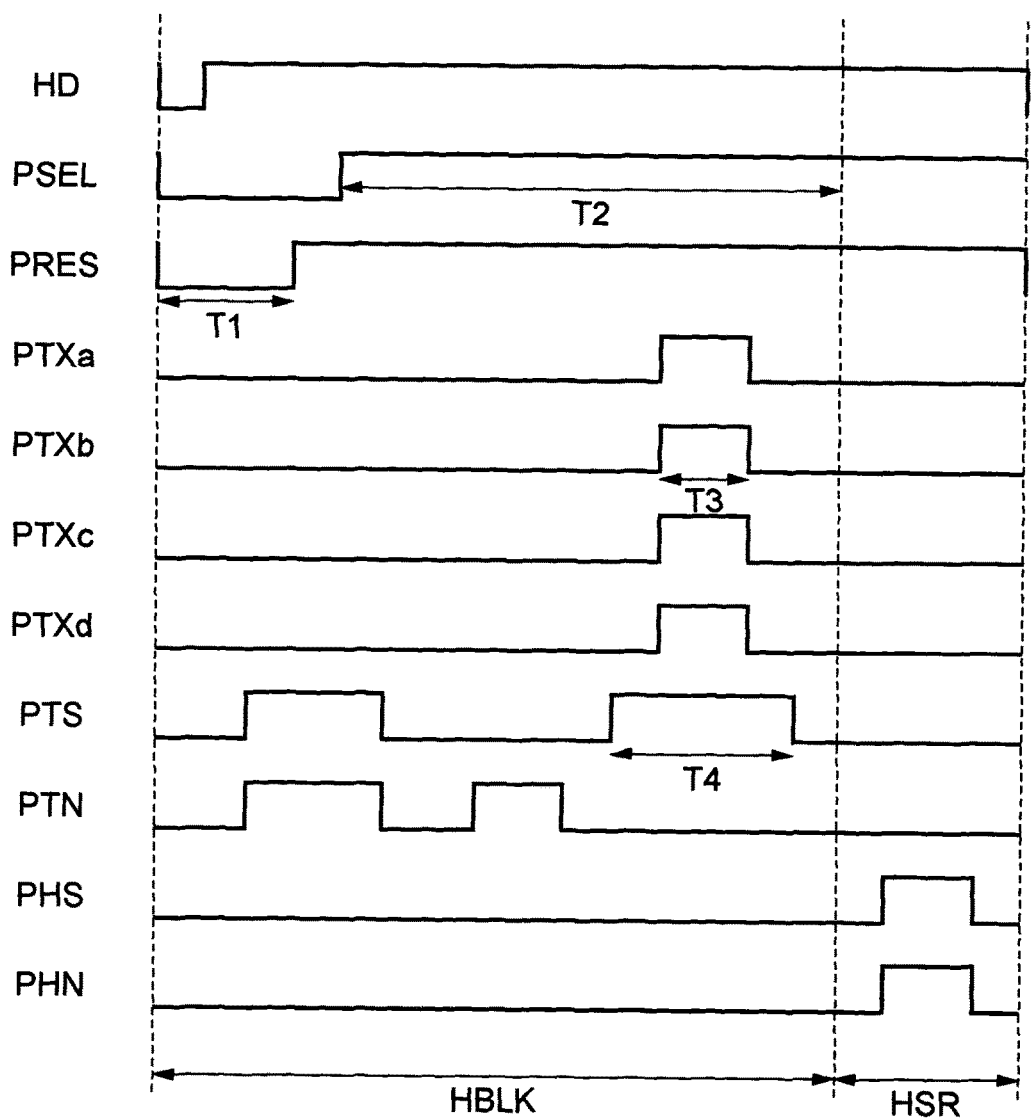
FIG. 13 is a timing chart showing a second driving timing according to the first embodiment.

FIG. 13 is a timing chart showing a second drive timing according to the embodiment of the present invention. The second drive timing described in FIG. 13 is a drive timing for collectively reading the output signals of the photoelectric conversion parts 402a to 402d shown in FIG. 11. The signal reading based on the second drive timing is performed, for example, when the output signals from the individual photoelectric conversion parts 402a to 402d are not necessary, such as during normal imaging, and the signal can be quickly read.

In the drive timing of FIG. 13, the PTN signal is set to a high level in a period in which the PSEL signal is in a high level, and the transfer capacitor 426 holds the signal of the noise components. This is the same as in the first drive timing described with reference to FIG. 12.

Then, a mixed signal of the optical charge and the noise components generated by the photoelectric conversion parts 402a to 402d is transferred. First not-shown a circuit resets the vertical output line 422 to a constant potential. The PTXa to PTXd signals are then set to a high level at the same time, the transfer gates 423a to 423d are turned on in a period of T3, and the optical charge accumulated in the photoelectric conversion parts 402a to 402d is transferred to the floating gate of the pixel amplifier 406. Since the PSEL signal remains at the high level, the source follower circuit is activated, and "optical signal+noise signal" according to the potential of the floating gate of the pixel amplifier 406 is output to the vertical output line 422. In the period of T4 including the period of T3, the PTS signal is set to a high level. As a result, the transfer capacitor 427 is connected to the vertical output line 422, and the transfer capacitor 427 holds a signal of optical components+noise components.

As described, the transfer capacitors 426 and 427 hold the noise components of one line and the optical signal+noise components of one line generated by the photoelectric conversion parts 402a to 402d.

In the period of HSR, the signals accumulated in the transfer capacitors 426 and 427 are transferred to the capacitors 430 and 431, respectively, based on the control pulses PHN and PHS controlled by a horizontal shift register (not shown). For the noise components and the optical signal+ noise components accumulated in the capacitors 430 and 431, the differential amplifier 432 calculates the difference of (optical signal+noise components)−noise components and outputs the optical signal.

According to the first embodiment, even if a plurality of photoelectric conversion parts formed in one pixel are separated by non-sensitive areas, the decrease in the sensitivity of the pixel caused by the non-sensitive areas and the degradation in the characteristics of angle of incidence can be alleviated.

Second Embodiment

Figure 14:
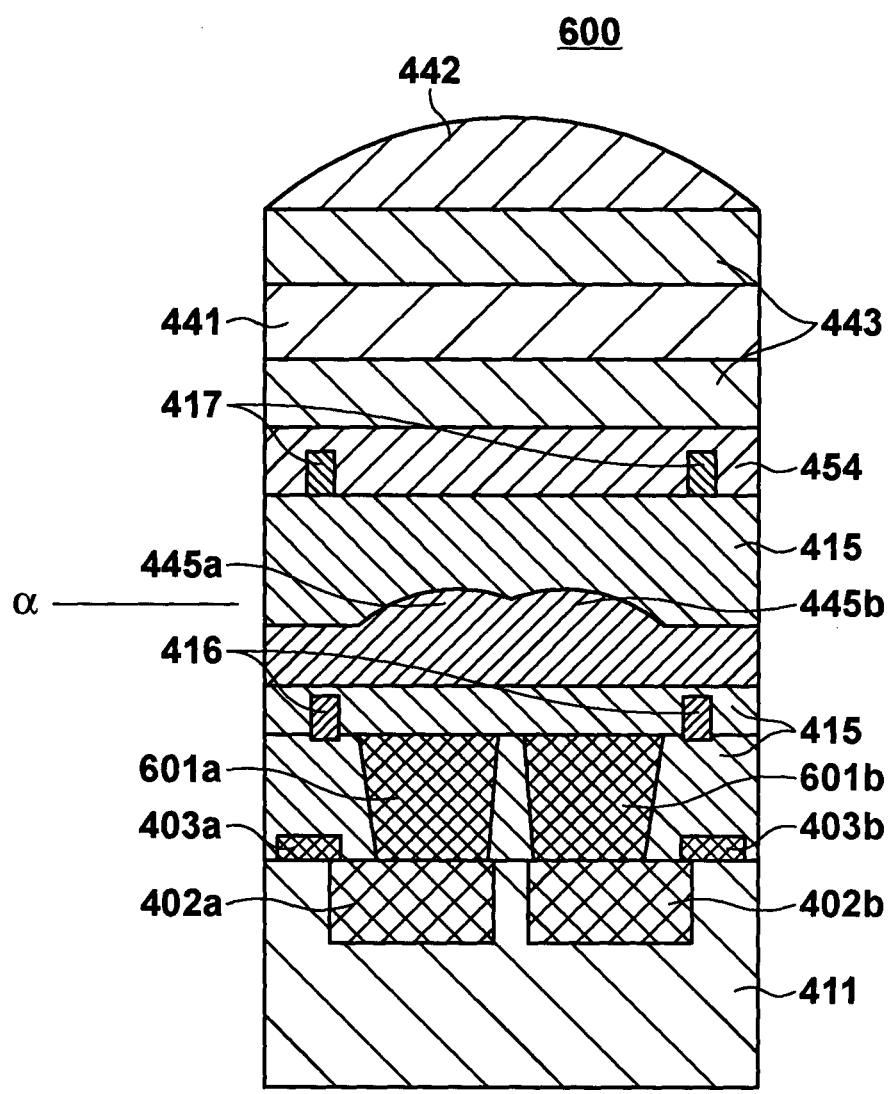
FIG. 14 is a cross-sectional view of one imaging pixel of an image sensor according to a second embodiment.

A second embodiment of the present invention will now be described. FIG. 14 is a cross-sectional view in the horizontal direction of one imaging pixel of an image sensor 600 according to the second embodiment. The image sensor 600 can be used in place of the image sensor 103 described in the first embodiment. In FIG. 14, the same members as in FIG. 3 are designated with the same reference numerals.

Differences in the structure from the image sensor 103 shown in FIG. 3 described in the first embodiment are the following two points. Light guides 601a and 601b are formed above the photoelectric conversion parts 402a and 402b, and the interlayer lenses 445a and 445b are arranged between the second electrodes 416 and the third electrodes 417. The rest is the same as in the configuration of FIG. 3, and the description will be appropriately skipped.

The microlens 442 is formed over the color filter 441 through the planarization layer 443. The thickness of the microlens 442 is set to have lens power that brings a pupil of a photographing lens (not shown) and an upper surface of the interlayer lenses 445a and 445b (image forming surface α of FIG. 14) into a substantial image formation relationship.

Light that enters the image sensor 600 according to the second embodiment will be described. In the pixel shown in FIG. 14, the luminous flux incident on the microlens 442 is converged, and the color filter 441 partially absorbs the luminous flux, and the luminous flux is converged near the surface of the interlayer lenses 445a and 445b (image forming surface α). As the microlens 442 forms a substantial image formation relationship between the pupil of the photographing lens (not shown) and the surface (image forming surface α) of the interlayer lenses 445a and 445b, the luminous flux incident on the interlayer lenses 445a and 445b reaches the photoelectric conversion parts 402a and 402b through the light guides 601a and 601b. Therefore, the photoelectric conversion parts 402a and 402b can receive the luminous flux of the pupil region where the apertures of the interlayer lenses 445a and 445b are projected on the pupil of the photographing lens.

According to the structure of the image sensor 600 of the second embodiment as described above, the luminous flux that would enter the separation region between the photoelectric conversion parts 402a and 402b conventionally can be converted on the photoelectric conversion parts 402a and 402b through the interlayer lenses 445a and 445b.

FIGS. 15A to 15C show states in which a luminous flux is converged on the apertures of the interlayer lenses 445a and 445b near the focus position of the microlens 442, and the luminous flux reaches the apertures of the light guides 601a and 601b according to the second embodiment.

FIG. 15A shows a state of a luminous flux at an angle of incidence 0, and the luminous flux is converged right at the center of the apertures of the interlayer lenses 445a and 445b. The interlayer lenses 445a and 445b then refract the luminous flux, and the luminous flux spreads and reaches the apertures of the light guides 601a and 601b, respectively.

FIG. 15B shows a state of a luminous flux at an angle of incidence θ1, and the luminous flux is converged at the optical center (apex of curvature) of the interlayer lens 445b. The interlayer lens 445b then refracts the luminous flux, and the luminous flux spreads and reaches the aperture of the light guide 601b.

FIG. 15C shows a state of the luminous flux at an angle of incidence θ2, and the luminous flux is converged at the edge of the interlayer lens 445b. The interlayer lens 445b refracts the luminous flux, and the luminous flux spreads and reaches the aperture of the light guide 601b.

FIGS. 16A to 16C are diagrams showing that the aperture position of the microlens 442 and the aperture of the light guide 601b are conjugate due to the interlayer lens 445 according to the second embodiment.

FIG. 16A shows a state in which a luminous flux that has reached the left edge of the microlens 442 at the angles of incidence 0 to θ2 reaches the aperture of the light guide 601b. As can be understood from FIG. 16A, the luminous flux is refracted by the microlens 442 and transmits through the entire aperture of the interlayer lens 445b, and is converged at the right edge of the aperture of the light guide 601b.

FIG. 16B shows a state in which a luminous flux that has reached the center of the microlens 442 at the angles of incidence 0 to θ2 reaches the aperture of the light guide 601b. As can be understood from FIG. 16B, the luminous flux is refracted by the microlens 442 and transmits through the entire aperture of the interlayer lens 445b, and is converged at the center portion of the aperture of the light guide 601b.

FIG. 16C shows a state in which a luminous flux that has reached the right edge of the microlens 442 at the angles of incidence 0 to θ2 reaches the aperture of the light guide 601b. As can be understood from FIG. 16C, the luminous flux is refracted by the microlens 442 and transmits through the entire aperture of the interlayer lens 445b, and is converted at the left edge of the aperture of the light guide 601b.

Although the luminous flux with angles of incidence in the left direction in the drawings has been described in FIGS. 15A to 15C and 16A to 16C, a luminous flux with angles of incidence in the right direction in the drawings enters the light guide 601a.

According to the second embodiment, the light guide can be used to attain the same advantageous effects as in the first embodiment.

Although the embodiments of the image capturing apparatus according to the embodiments of the present invention have been described with reference to FIGS. 1 to 16C, the present invention is not limited to the embodiments, and various embodiments are possible.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-132707, filed Jun. 14, 2011, which is hereby incorporated by reference herein in its entirety.

The invention claimed is:

1. An image sensor comprising:
a plurality of pixels, wherein each pixel of said plurality of pixels comprises:

a plurality of photoelectric conversion parts, each one of the plurality of photoelectric conversion parts receiving a luminous flux passing through a different part of a pupil of a photographing lens and outputting an output signal based on photoelectric conversion;
a microlens; and
a plurality of interlayer lenses formed between said plurality of photoelectric conversion parts and said microlens and integrally formed to correspond to respective ones of the plurality of photoelectric conversion parts,
wherein said plurality of interlayer lenses cause light incident on said plurality of interlayer lenses to enter said corresponding plurality of photoelectric conversion parts and are arranged at a focus position of said microlens, and
wherein said microlens and said plurality of photoelectric conversion parts are conjugate due to said plurality of interlayer lenses.

2. The image sensor according to claim 1, wherein each of said pixels further comprises a plurality of light guides formed between said plurality of interlayer lenses and said plurality of photoelectric conversion parts.

3. The image sensor according to claim 1, wherein said plurality of interlayer lenses have a gapless lens structure.

4. The image sensor according to claim 1, wherein said plurality of photoelectric conversion parts in each of said pixels are separated by a region where photoelectric conversion is not performed, and the area includes at least one of a configuration shared by said plurality of photoelectric conversion parts and a separation region for separating said plurality of photoelectric conversion parts.

5. The image sensor according to claim 1, wherein the image sensor is incorporated in an image capturing apparatus that includes:
the photographing lens,
wherein the image sensor receives incoming light from said photographing lens.

6. A forming method of forming a plurality of interlayer lenses in an image sensor, the image sensor comprising a plurality of pixels, wherein each pixel of said plurality of pixels comprises a plurality of photoelectric conversion parts, each one of the plurality of photoelectric conversion parts receiving a luminous flux passing through a different part of a pupil of a photographing lens and outputting an output signal based on photoelectric conversion, a microlens, and said plurality of interlayer lenses formed between said plurality of photoelectric conversion parts and said microlens and integrally formed to correspond to respective ones of the plurality of photoelectric conversion parts, wherein said plurality of interlayer lenses cause light incident on said plurality of interlayer lenses to enter said corresponding plurality of photoelectric conversion parts, said forming method comprising:

a first step of forming a layer that serves as a material of said plurality of interlayer lenses;
a second step of forming an organic material over the layer formed in said first step;
a third step of using a gray-tone mask to form shapes of said plurality of interlayer lenses through photolithography, on the layer formed in said second step; and
a fourth step of transferring the shapes formed in said third step to the layer formed in said first step through etchback.

7. The method according to claim 6, wherein each of said pixels further comprises a plurality of light guides formed between said plurality of interlayer lenses and said plurality of photoelectric conversion parts.

8. The method according to claim 6, wherein said plurality of interlayer lenses have a gapless lens structure.

9. The method according to claim 6, wherein said plurality of photoelectric conversion parts in each of said pixels are separated by a region where photoelectric conversion is not performed, and the area includes at least one of a configuration shared by said plurality of photoelectric conversion parts and a separation region for separating said plurality of photoelectric conversion parts.

10. The method according to claim 6, wherein the image sensor is incorporated in an image capturing apparatus that includes:
a photographing lens,
wherein the image sensor receives incoming light from said photographing lens.

11. An image capturing apparatus comprising an image sensor including a plurality of pixels, and using signals output from the image sensor as focus detection signals or 3D image generation signals,
wherein each pixel of said plurality of pixels comprises:
a plurality of photoelectric conversion parts, each one of the plurality of photoelectric conversion parts receiving a luminous flux passing through a different part of a pupil of a photographing lens and outputting an output signal based on photoelectric conversion;
a microlens; and
a plurality of interlayer lenses formed between said plurality of photoelectric conversion parts and said microlens and integrally formed to correspond to respective ones of the plurality of photoelectric conversion parts,
wherein said plurality of interlayer lenses cause light incident on said plurality of interlayer lenses to enter said corresponding plurality of photoelectric conversion parts and are arranged at a focus position of said microlens, and
wherein said microlens and said plurality of photoelectric conversion parts are conjugate due to said plurality of interlayer lenses.

* * * * *